United States Patent
Veerasamy et al.

(10) Patent No.: US 7,030,390 B2
(45) Date of Patent: *Apr. 18, 2006

(54) ION SOURCE WITH ELECTRODE KEPT AT POTENTIAL(S) OTHER THAN GROUND BY ZENER DIODE(S), THYRISTOR(S) AND/OR THE LIKE

(75) Inventors: Vijayen S. Veerasamy, Ann Arbor, MI (US); Rudolph Hugo Petrmichl, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/919,479

(22) Filed: Aug. 17, 2004

(65) Prior Publication Data
US 2005/0104007 A1 May 19, 2005

Related U.S. Application Data

(60) Provisional application No. 60/501,020, filed on Sep. 9, 2003.

(51) Int. Cl.
*H01J 27/00* (2006.01)

(52) U.S. Cl. .............. 250/423 R; 315/111.21

(58) Field of Classification Search .............. None
See application file for complete search history.

(56) References Cited

U.S. PATENT DOCUMENTS

| 5,855,745 | A | | 1/1999 | Manley |
| 5,969,470 | A | * | 10/1999 | Druz et al. ............... 313/359.1 |
| 6,140,773 | A | * | 10/2000 | Anders et al. ........... 315/111.21 |
| 6,366,346 | B1 | | 4/2002 | Nowak et al. |
| 6,368,664 | B1 | | 4/2002 | Veerasamy et al. |
| 6,465,793 | B1 | | 10/2002 | Anders |
| 6,548,817 | B1 | | 4/2003 | Anders et al. |
| 6,595,399 | B1 | | 7/2003 | Cassese |
| 6,596,399 | B1 | | 7/2003 | Veerasamy |
| RE38,358 | E | | 12/2003 | Petrmichl |
| 6,713,179 | B1 | | 3/2004 | Veerasamy |
| 6,812,648 | B1 | | 11/2004 | Luten et al. |
| 6,815,690 | B1 | | 11/2004 | Veerasamy et al. |
| 2005/0082493 | A1 | * | 4/2005 | Petrmichl ............... 250/423 R |

* cited by examiner

*Primary Examiner*—Nikita Wells
*Assistant Examiner*—Zia R. Hashmi
(74) *Attorney, Agent, or Firm*—Nixon & Vanderhye P.C.

(57) ABSTRACT

An ion source is provided, which generates or emits an ion beam which may be used to deposit a layer on a substrate, or the perform other functions. The ion source includes at least one anode and at least one cathode. In certain example embodiments, the cathode(s) is maintained or kept at a reference potential(s) other than ground for at least a period of time. This may be done, for example and without limitation, by electrically connecting a zener diode (single or double type, for example), thyristor (actively), or the like to the cathode. Thus, the ion source can be made so that it does not react adversely to its environment, and/or undesirable arcing between the anode and cathode can be reduced thereby improving ion source operation.

17 Claims, 6 Drawing Sheets

Fig. 2

(PRIOR ART)

Fig. 3

(PRIOR ART)

ION SOURCE WITH ELECTRODE KEPT AT POTENTIAL(S) OTHER THAN GROUND BY ZENER DIODE(S), THYRISTOR(S) AND/OR THE LIKE

This application claims priority on Provisional U.S. Patent Application Ser. No. 60/501,020, filed Sep. 9, 2003, the disclosure of which is hereby incorporated herein by reference.

This invention relates to an ion source for generating an ion beam (diffuse, focused, or collimated), wherein the ion source is operable via a technique which maintains an electrode of the ion source (e.g., the cathode) at a potential other than ground during at least a portion of operation.

BACKGROUND

An ion source is a device that causes gas molecules to be ionized and then accelerates and emits the ionized gas molecules and/or atoms in a beam toward a substrate. Such an ion beam may be used for various purposes, including but not limited to cleaning a substrate, activation, polishing, etching, and/or deposition of thin film coatings/layer(s). Example ion sources are disclosed, for example, in U.S. Pat. Nos. 6,359,388; 6,037,717; 6,002,208; and 5,656,819, the disclosures of which are all hereby incorporated herein by reference.

Figure 1:
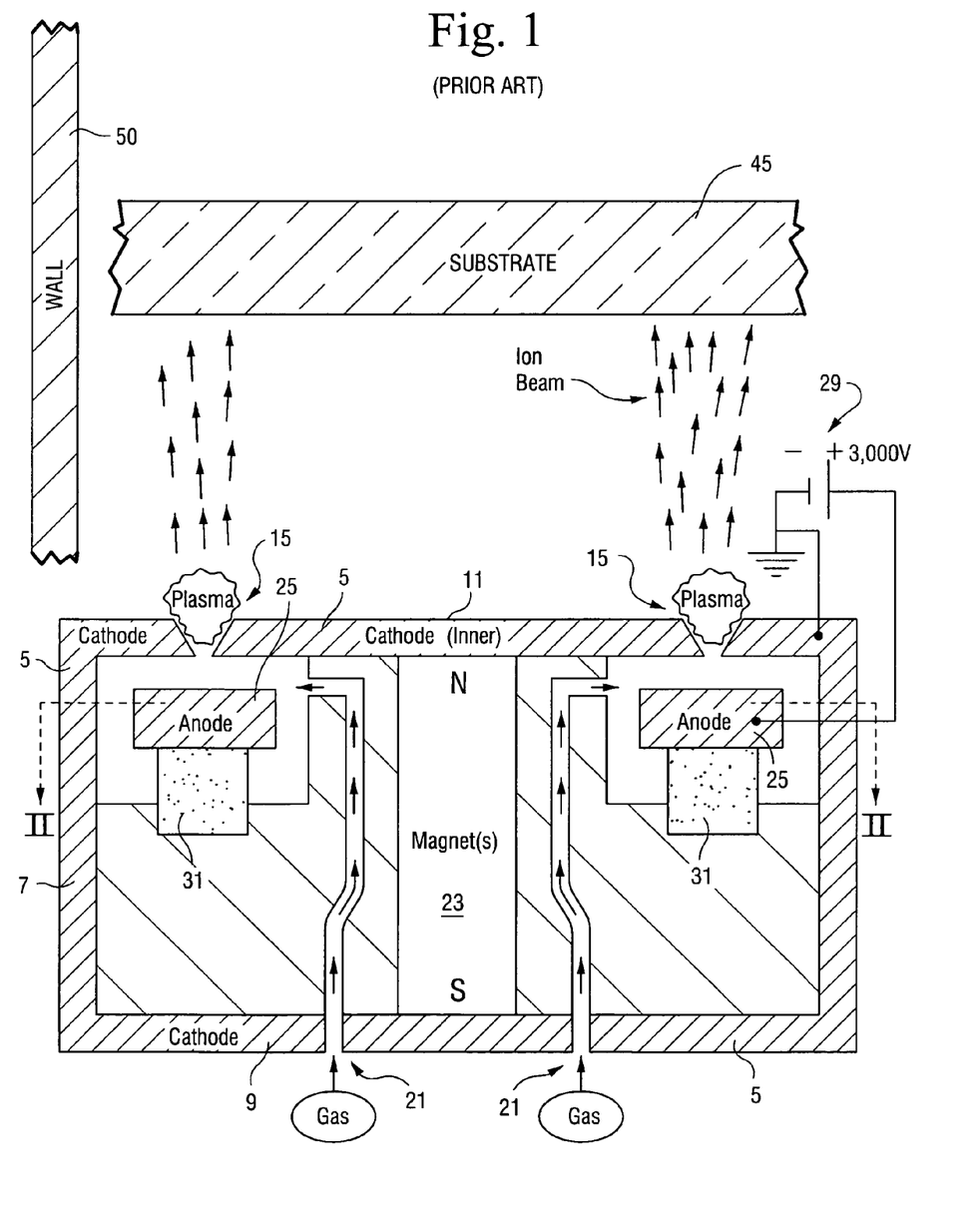
FIGS. 1–3 illustrate a conventional cold cathode ion source.
Figure 2:
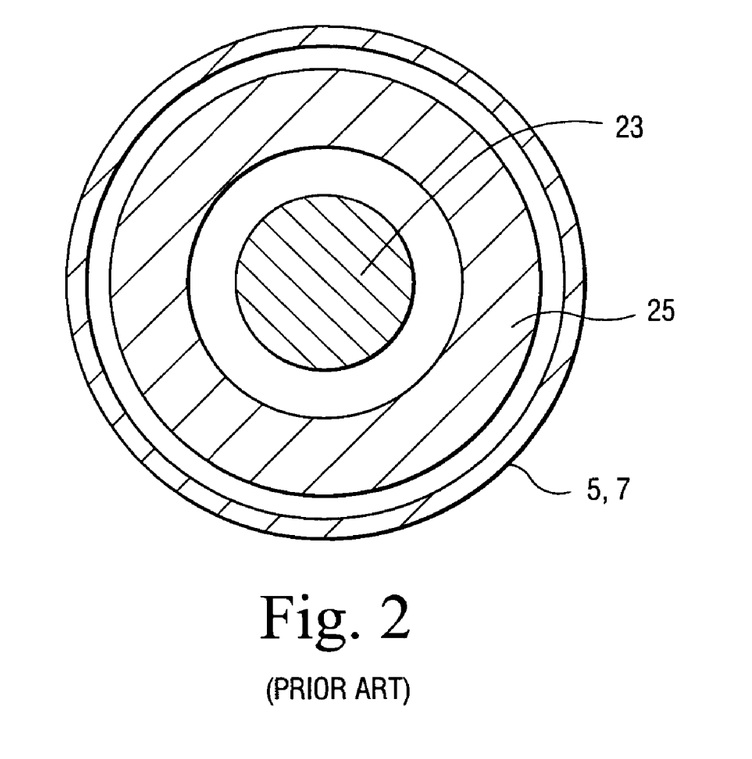
Figure 3:
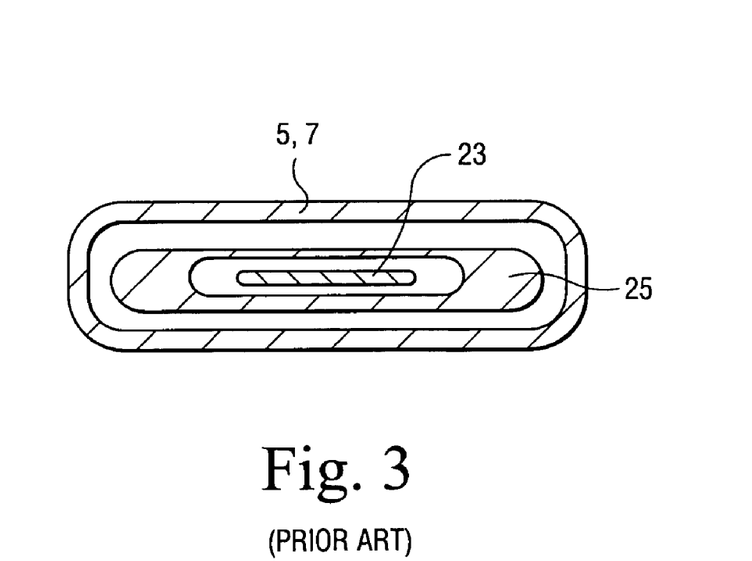

FIGS. 1–2 illustrate a conventional cold-cathode type ion source. In particular, FIG. 1 is a side cross-sectional view of an ion beam source with an ion beam emitting slit defined in the cathode, and FIG. 2 is a corresponding sectional plan view along section line II—II of FIG. 1. FIG. 3 is a sectional plan view similar to FIG. 2, for purposes of illustrating that the FIG. 1 ion beam source may have an oval and/or racetrack-shaped ion beam emitting slit as opposed to a circular ion beam emitting slit. Any other suitable shape may also be used.

Referring to FIGS. 1–3, the ion source includes a hollow housing made of a magnetoconductive material such as steel, which is used as a cathode 5. Cathode 5 includes cylindrical or oval side wall 7, a closed or partially closed bottom wall 9, and an approximately flat top wall 11 in which a circular or oval ion emitting slit and/or aperture 15 is defined. The bottom 9 and side wall(s) 7 of the cathode 5 are optional. Ion emitting slit/aperture 15 includes an inner periphery as well as an outer periphery. Deposit and/or maintenance gas supply aperture or hole(s) 21 is/are formed in bottom wall 9. Flat top wall 11 functions as an accelerating electrode. A magnetic system including a cylindrical permanent magnet 23 with poles N and S of opposite polarity is placed inside the housing between bottom wall 9 and top wall 11. The N-pole faces flat top wall 11, while the S-pole faces bottom wall 9. The purpose of the magnetic system with a closed magnetic circuit formed by the magnet 23 and cathode 5 is to induce a substantially transverse magnetic field (MF) in an area proximate ion emitting slit 15.

The ion source may be entirely or partially within conductive wall 50; and/or wall 50 may at least partially define the deposition chamber. In certain instances, wall 50 may entirely surround the source and substrate 45, while in other instances the wall 50 may only partially surround the ion source and/or substrate.

A circular or oval shaped conductive anode 25, electrically connected to the positive pole of electric power source 29, is arranged so as to at least partially surround magnet 23 and be approximately concentric therewith. Anode 25 may be fixed inside the housing by way of insulative ring 31 (e.g., of ceramic). Anode 25 defines a central opening therein in which magnet 23 is located. The negative pole of electric power source 29 is grounded and connected to cathode 5, so that the cathode is negative with respect to the anode. Generally speaking, the anode 25 is generally biased positive by several thousand volts. Meanwhile, the cathode (the term "cathode" as used herein includes the inner and/or outer portions thereof) is generally held at ground potential. This is the case during all aspects of source operation, including during a mode in which the source is being cleaned.

The conventional ion beam source of FIGS. 1–3 is intended for the formation of a unilaterally directed tubular ion beam, flowing in the direction toward substrate 45. Substrate 45 may or may not be biased in different instances. The ion beam emitted from the area of slit/aperture 15 is in the form of a circle in the FIG. 2 embodiment and in the form of an oval (e.g., race-track) in the FIG. 3 embodiment. The conventional ion beam source of FIGS. 1–3 operates as follows in a depositing mode when it is desired to ion beam deposit a layer(s) on substrate 45. A vacuum chamber in which the substrate 45 and slit/aperture 15 are located is evacuated, and a depositing gas (e.g., a hydrocarbon gas such as acetylene, or the like) is fed into the interior of the source via aperture(s) 21 or in any other suitable manner. A maintenance gas (e.g., argon) may also be fed into the source in certain instances, along with the depositing gas. Power supply 29 is activated and an electric field is generated between anode 25 and cathode 5, which accelerates electrons to high energy. Anode 25 is positively biased by several thousand volts, and cathode 5 is at ground potential as shown in FIG. 1. Electron collisions with the gas in or proximate aperture/slit 15 leads to ionization and a plasma is generated. "Plasma" herein means a cloud of gas including ions of a material to be accelerated toward substrate 45. The plasma expands and fills (or at least partially fills) a region including slit/aperture 15. An electric field is produced in slit 15, oriented in the direction substantially perpendicular to the transverse magnetic field, which causes the ions to propagate toward substrate 45. Electrons in the ion acceleration space in and/or proximate slit/aperture 15 are propelled by the known E×B drift in a closed loop path within the region of crossed electric and magnetic field lines proximate slit/aperture 15. These circulating electrons contribute to ionization of the gas (the term "gas" as used herein means at least one gas), so that the zone of ionizing collisions extends beyond the electrical gap between the anode and cathode and includes the region proximate slit/aperture 15 on one and/or both sides of the cathode 5. For purposes of example, consider the situation where a silane and/or acetylene ($C_2H_2$) depositing gas is/are utilized by the ion source of FIGS. 1–3 in a depositing mode. The silane and/or acetylene depositing gas passes through the gap between anode 25 and cathode 5.

Unfortunately, the cold-cathode closed-drift ion source of FIG. 1 is problematic in the following respects. Cathode 5, along with the negative terminal of the power supply 29 (e.g., DC power supply), and wall 50 are all commonly grounded. Meanwhile, the positive terminal of the power supply 29 is electrically connected to the anode 25. During operation, as a result of this circuit, ions of carbon or the like from the feedstock gas tend to hit and coat the cathode during ion beam operation. This coating is insulating and thus causes sparking to occur which results in inefficient ion source operation (e.g., current goes down).

In view of the above, it will be apparent that there exists a need in the art for a technique for improving the efficiency and stability of ion source operation.

BRIEF SUMMARY OF EXAMPLES OF THE INVENTION

In order to address the aforesaid need, in certain example embodiments of this invention the cathode of the ion source is maintained or kept at a reference potential(s) other than ground. This may be done by electrically connecting a zener diode (single or double type, for example) (passively), thyristor (actively), or the like to the cathode. For example, and without limitation, the anode may thus be at about +3000 V, the cathode at about the voltage of the zener or thyristor such as about +50 V, and the walls grounded. Thus, the ion source can be made so that it does not react adversely to its environment. Undesirable arcing between the anode and cathode can be reduced, thereby improving ion source operation.

Ions of carbon tend to hit and coat the cathode during ion beam operation. This coating is insulating and thus causes sparking to occur which causes inefficient ion source operation (e.g., current goes down). The zener diode, thyristor or the like can prevent or reduce this problem, because the current running through the anode/cathode circuit will be substantially constant when desired. The zener/thyristor is preferably in series with the power supply and ion beam. Thus, approximately the same current through the anode/cathode circuit will be maintained regardless of whether a coating (e.g., carbon) is on the cathode, thereby reducing sparking or other disturbance in the current. More constant current allows for a more constant deposition rate, and thus more efficient ion source operation.

The power supply may or may not be grounded in different embodiments of this invention. In embodiments where the power supply is not grounded, a floating mode with respect to ground is realized for the source. In floating mode, both the power supply and the cathode are not grounded (but the wall is preferably grounded). In certain example floating mode embodiments, the positive terminal of the power supply is electrically connected to the anode of the ion source and the negative terminal of the power supply is electrically connected to the cathode of the ion source. Since the wall(s) may be grounded, but the cathode and power supply are not (they are floating with respect to ground), the likelihood of formation of the aforesaid problematic secondary circuit from the source to the power supply through the walls can be reduced and/or eliminated (or suppressed). Therefore, the chance of drawing a net positive charge from the ion source which induces a positive charge on dielectric surfaces proximate the wall(s) can be suppressed and/or reduced. Floating mode may or may not be used in combination with a zener diode or thyristor for maintaining the cathode of the ion source at a reference potential(s) other than ground in different embodiments of this invention.

In certain example embodiments of this invention, there is provided a method of operating an ion source, the method comprising: providing an ion source including an anode, a cathode and a conductive wall(s), the wall(s) at least partially surrounding a deposition chamber, and wherein a power supply is in electrical communication with the anode and/or cathode of the ion source; and maintaining the cathode of the ion source at a potential(s) other than ground for at least a period of time during ion source operation.

In other example embodiments of this invention, there is provided an ion source (for emitting diffused, collimated or any other suitable type of ion beam) comprising: an anode, a cathode and a conductive wall(s) at least partially surrounding a deposition chamber; a power supply in electrical communication with the anode and/or cathode of the ion source; means for maintaining the cathode of the ion source at a potential(s) other than ground. In certain example embodiments, the means for maintaining the cathode at a potential other than ground comprises: (a) a zener diode in electrical communication with the cathode, and/or (b) a thyristor in electrical communication with the cathode.

In other example embodiments of this invention, there is provided a method of making a coated article (e.g., vehicle window, architectural window, glass coated table-top, other type of window, etc.), the method comprising: providing an ion source including an anode, a cathode and a conductive wall(s), the wall(s) at least partially surrounding a deposition chamber, and wherein a power supply is in electrical communication with the anode and/or cathode of the ion source; providing a substrate (e.g., glass substrate) in the deposition chamber; and ion beam depositing a layer on the substrate (either directly or indirectly on the substrate) while maintaining the cathode of the ion source at a potential(s) other than ground for at least a period of time while the layer is being deposited on the substrate. The cathode may be at the potential(s) other than ground during the entire deposition process of the layer, or for only a portion of the process in different embodiments of this invention.

DETAILED DESCRIPTION OF EXAMPLE EMBODIMENTS OF INVENTION

Referring now more particularly to the accompanying drawings in which like reference numerals indicate like parts throughout the several views.

Figure 4:
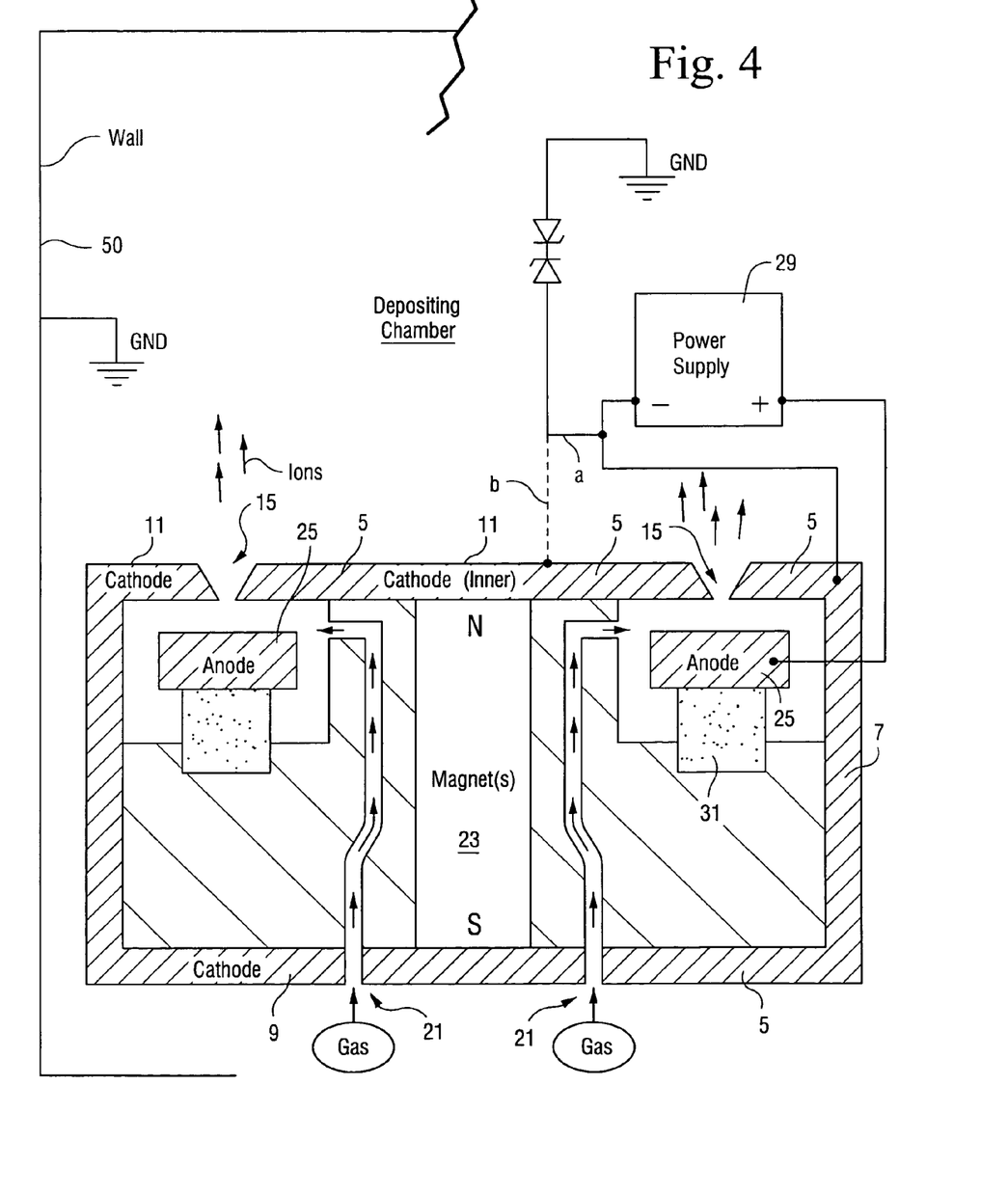
FIG. 4 is a cross sectional view of a cold cathode ion source according to an example embodiment of this invention, wherein a zener diode is used to keep the cathode of the ion source at a reference potential(s) other than ground during operation and/or cleaning of the ion source.

FIG. 4 is a cross sectional view of a cold cathode ion source according to an example embodiment of this invention. FIGS. 2–3 are applicable to FIG. 4, as for example plan views.

In the FIG. 4 embodiment, the cathode 5 of the ion source is kept or maintained at a potential(s) other than ground by zener diode(s) 50 (i.e., the cathode is kept at the potential(s) in a passive manner due to the use of the zener diode(s)). The zener diode is electrically connected to the cathode 5 of the ion source. The solid connection line "a" in FIG. 4 illustrates that the zener diode 50 may be electrically connected to the cathode 5 via the same terminal or lead used to electrically connect the negative terminal of power supply 29 to the cathode 5. Alternatively, the dotted connection line "b" in FIG. 4 illustrates that the zener diode 50 may be electrically connected to cathode 5 via some other lead not used by the power supply. In either case, the zener diode 50 keeps the cathode 5 of the ion source at a potential(s) other than ground during ion source operation. The zener diode 50 is electrically in series with the power supply and the anode/cathode circuit.

Zener diode 50 does not conduct until a predetermined threshold voltage is applied thereacross. Once that threshold voltage is achieved, the diode 50 becomes conductive. Thus, if the cathode 5 exceeds a predetermined threshold potential determined by the zener diode, the zener diode 50 will become conductive thereby effectively preventing the cathode 5 from exceeding that threshold potential. Thus, the zener acts as a current stabilizer. A more stable operation is thus provided. Various types of zeners (e.g., single zener diode, double zener diode(s), etc.) may be used in different embodiments.

For example, and without limitation, the anode 25 may be at about +3000 V via the power supply, the cathode 5 at about the voltage of the zener 50, and the walls grounded. Ions of carbon tend to hit and coat the cathode during ion beam operation. This coating is insulating and thus causes sparking to occur which causes inefficient ion source operation (e.g., current goes down). However, the zener diode 50 or the like can prevent or reduce this problem, because the current running through the anode/cathode circuit will be substantially constant when desired due to the zener. Thus, approximately the same current through the anode/cathode circuit will be maintained regardless of whether a coating (e.g., carbon) is on the cathode, thereby reducing sparking or other disturbance in the current. More constant current allows for a more constant deposition rate, and thus more efficient ion source operation.

The FIG. 4 embodiment may also utilize a floating mode. In particular, both the power supply 29 and the cathode 5 are not grounded. Thus, they are floating with respect to ground. In certain example floating mode embodiments, the positive terminal of the power supply 29 is electrically connected to the anode 25 of the ion source and the negative terminal of the power supply is electrically connected to the cathode 5 of the ion source but is not grounded. Since the wall(s) 50 may be grounded, but the cathode 5 and power supply are not (they are floating with respect to ground), the likelihood of formation of a problematic secondary circuit from the source to the power supply through the walls can be reduced and/or eliminated (or suppressed). Therefore, the chance of drawing a net positive charge from the ion source which induces a positive charge on dielectric surfaces proximate the wall(s) can be suppressed and/or reduced.

This floating mode technique has the advantage relative to a so-called biased mode in that the ion source is completely decoupled from the chamber walls and thus is self-neutralized and self-regulating. Consequently, rate does not significantly change as glass moves under/over the beam. This mode requires only one power supply in certain example embodiments.

In certain example embodiments, the potential of surfaces (e.g., dielectric surfaces) formed on the wall(s) may stay proximate zero, which is desirable.

Example advantages associated with the floating mode illustrated in FIG. 4 include one or more of: (a) no or less neutralization sparking at the wall(s) and no intense disruptive neutralization arcing on the cathode face, which may occur after prolonged deposition of dielectric film with un-neutralized beam(s); (b) no or little sensitivity to changing electrical conditions external to the ion source (e.g., instabilities associated with glass-to-be-coated moving under the source in an in-line coater can be reduced or eliminated); (c) elimination or reduction of conductivity induced changes in processing rate (deposition or etch) at the edge of the glass, consequently improving processing uniformity over the entire substrate surface; (d) less possibility of breakdown damage on conductive substrates or conductive films; and/or (e) less or no need for a secondary power supply, substrate voltage sensing device, and/or active feedback control circuit.

The advantages of using a floating mode in the context of a cold-cathode type ion source are differentiated from that in a hot-cathode ion source. In a hot-cathode source, a tungsten cathode emit electrons because it is heated (i.e., the tungsten filament cathode is heated thereby causing it to emit electrons which move toward the anode and through the "gap" thereby creating ions). Unfortunately, hot-cathode type ion sources are problematic in that they cannot be run at high voltages. Thus, high ion energies cannot be used during deposition and/or etching. In contrast, a cold-cathode type ion source is one where the majority of electrons generated/emitted by the cathode are generated/emitted due to secondary electron emissions (unlike in a hot-cathode type source). In particular, in a cold cathode source, the cathode is not significantly heated to a glowing point. Instead, high voltage can be applied across the anode-cathode, and the cathode is caused to emit electrons due to being bombarded by ions from the gap (i.e., the majority of electrons from the cathode are caused by secondary electron emissions). Cold-cathode type sources are advantageous in that they can utilize high voltages, and thus enable high ion energies to be used during deposition and/or etching. Unfortunately, cold-cathode type sources suffer from the problems discussed above in the background section. Such problems are solved herein by utilizing one or more of the embodiments of any of FIGS. 4–7, and/or any other suitable embodiment of this invention.

Figure 5:
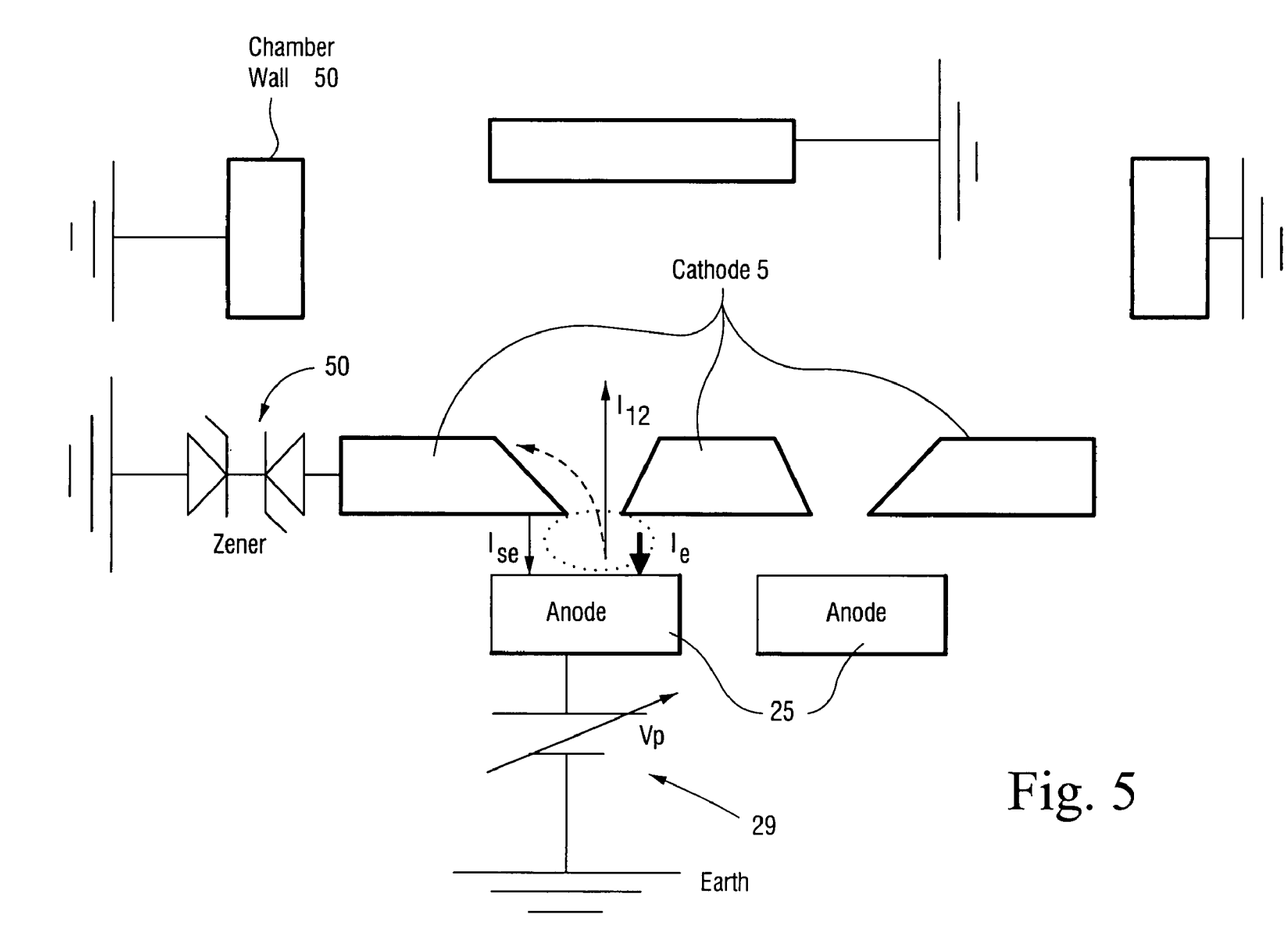
FIG. 5 is a circuit diagram of a cold cathode ion source according to an example embodiment of this invention, which is similar to the FIG. 4 embodiment except that the power supply is grounded.

FIG. 5 is a circuit diagram illustrating another example embodiment of this invention. The FIG. 5 embodiment is the same as the FIG. 4 embodiment, except that the power supply is grounded.

Figure 6:
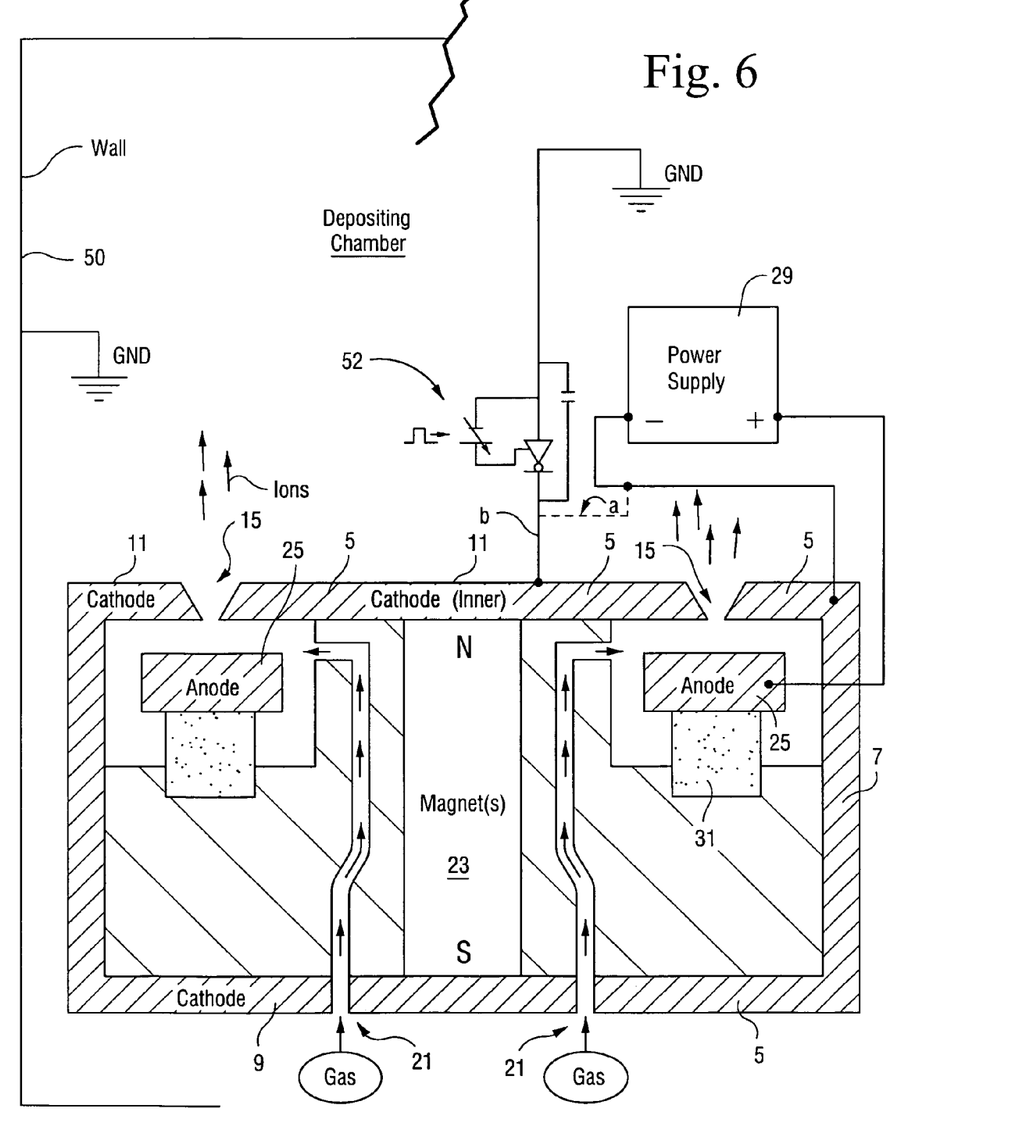
FIG. 6 is a cross sectional view of a cold cathode ion source according to an example embodiment of this invention, wherein a thyristor is used to keep the cathode of the ion source at a reference potential(s) other than ground during operation and/or cleaning of the ion source.

FIG. 6 is a cross sectional view of a cold cathode ion source according to another example embodiment of this invention. FIGS. 2–3 are applicable to FIG. 6, as for example plan views. In the FIG. 6 embodiment, the cathode 5 of the ion source is kept or maintained at a potential(s) other than ground by thyristor 52 (i.e., the cathode is actively controlled so as to be kept at the potential(s) other than ground due to the use of the thyristor(s)). The thyristor 52 is electrically connected to the cathode 5 of the ion source. The dotted connection line "a" in FIG. 6 illustrates that the thyristor 52 may be electrically connected to the cathode 5 via the same terminal or lead used to electrically connect the negative terminal of power supply 29 to the cathode 5. Alternatively, the solid connection line "b" in FIG. 6 illustrates that the thyristor 52 may be electrically connected to cathode 5 via some other lead not used by the power supply. In either case, the thyristor 52 keeps the cathode 5 of the ion source at a potential(s) other than ground during ion source operation. As with the zener embodiment, this embodiment may or may not be used in combination with floating mode.

FIG. 6 for example illustrates that the power supply 29 is not grounded, so that the power supply is in a floating mode.

Figure 7:
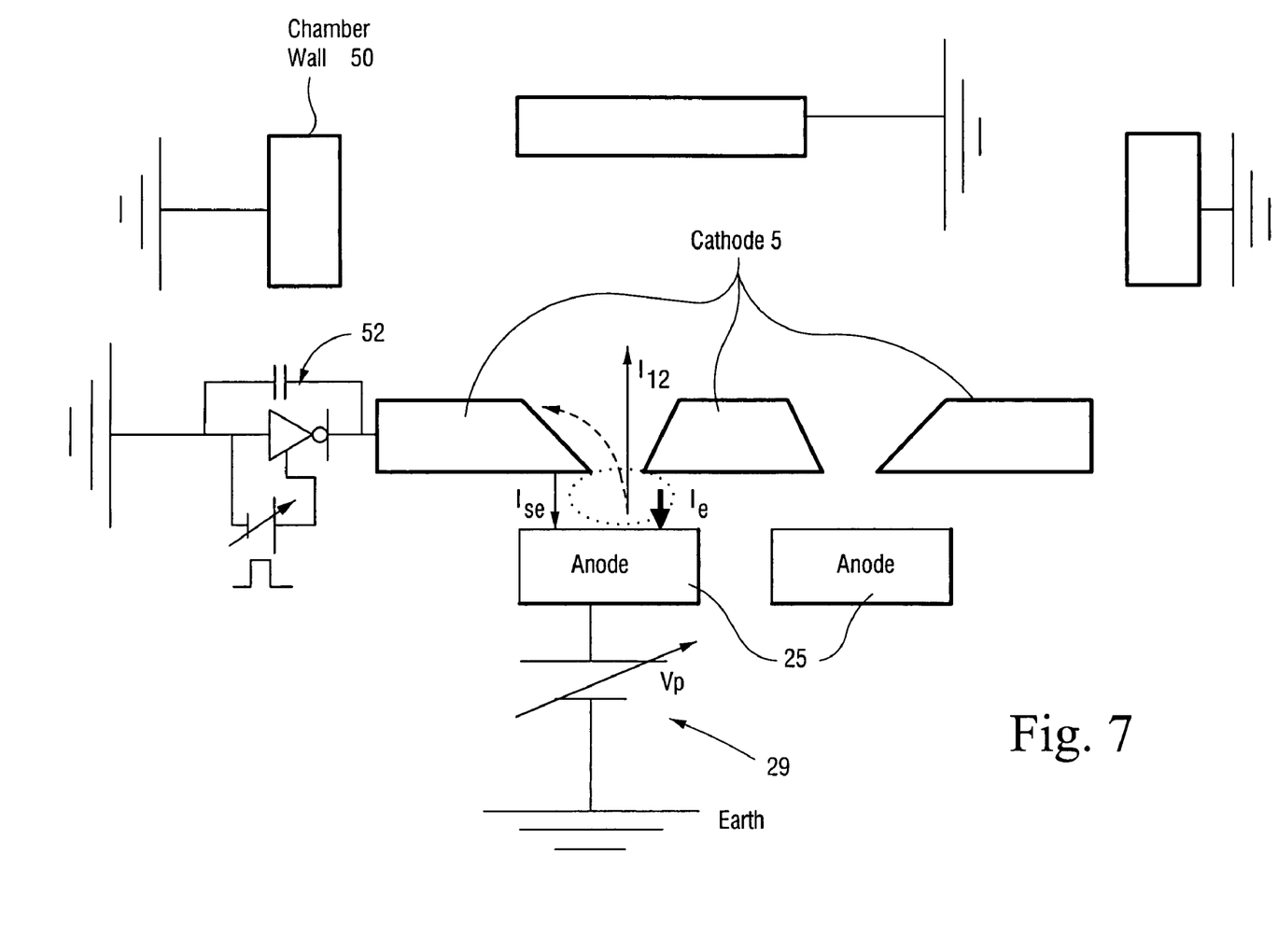
FIG. 7 is a circuit diagram of a cold cathode ion source according to an example embodiment of this invention, which is similar to the FIG. 6 embodiment except that the power supply is grounded.

FIG. 7 is a circuit diagram illustrating another example embodiment of this invention. The FIG. 7 embodiment is the same as the FIG. 6 embodiment, except that the power supply is grounded in the FIG. 7 embodiment.

In certain alternative embodiments of this invention, the wall 50 need not be grounded. In such embodiments, the wall 50 can be kept or maintained at a potential(s) other than ground by zener diode 50 or thyristor 52 in a manner similar to the embodiments shown in FIGS. 4–7, except that the shield is not connected to the power supply. In certain example embodiments, a conductive shield external the source itself may be kept or maintained at a potential(s) other than ground by zener diode 50 or thyristor 52 in a manner similar to the embodiments shown in FIGS. 4–7, except that the shield is not connected to the power supply.

Any of the embodiments above may be used in the context of using the ion source to deposit a layer on a substrate (directly where the layer is in contact with the substrate, or indirectly where other layers are between the layer and the substrate). The substrate 45 may be glass or any other suitable material. Thus, coated articles such as architectural windows, vehicle windows, or other types of windows (or any other suitable type of coated article) may be made using an ion source(s) according to certain example embodiments of this invention. Alternatively, the ion source may instead or in addition be used to ion beam mill a surface of a substrate in order to remove impurities or the like.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. An ion source comprising:
    an anode, a cathode and a conductive wall(s) at least partially surrounding a deposition chamber;
    a power supply in electrical communication with the anode and/or cathode of the ion source;
    means for maintaining the cathode of the ion source at a potential(s) other than ground.

2. The ion source of claim 1, wherein said means for maintaining the cathode at a potential other than ground comprises at least one of: (a) a zener diode in electrical communication with the cathode, and (b) a thyristor in electrical communication with the cathode.

3. The ion source of claim 1, wherein both the power supply and the cathode are not grounded.

4. The ion source of claim 3, wherein at least a portion of the conductive wall(s) is grounded.

5. The ion source of claim 1, wherein a positive terminal of the power supply is electrically connected to the anode and a negative terminal of the power supply is electrically connected to the cathode.

6. An ion source comprising:
    an anode and a cathode;
    a power supply in electrical communication with the anode and/or cathode of the ion source;
    at least one diode and/or thyristor in electrical communication with the cathode for maintaining the cathode of the ion source at a potential(s) other than ground during at least some part of ion source operation.

7. The ion source of claim 6, wherein both the power supply and the cathode are not grounded, and wherein a conductive wall of the source is grounded.

8. The source of claim 6, wherein a positive terminal of the power supply is electrically connected to the anode and a negative terminal of the power supply is electrically connected to the cathode.

9. An ion source comprising:
    an anode, a cathode and a conductive wall(s) at least partially surrounding a deposition chamber;
    a power supply in electrical communication with the anode and/or cathode of the ion source;
    at least one circuit for maintaining the cathode of the ion source at a potential(s) other than ground.

10. The ion source of claim 9, wherein said at least one circuit for maintaining the cathode at a potential other than ground comprises (a) a zener diode in electrical communication with the cathode, and/or (b) a thyristor in electrical communication with the cathode.

11. The ion source of claim 9, wherein both the power supply and the cathode are not grounded.

12. A method of operating an ion source, the method comprising:
    providing an ion source including an anode, a cathode and a conductive wall(s), the wall(s) at least partially surrounding a deposition chamber, and wherein a power supply is in electrical communication with the anode and/or cathode of the ion source; and
    maintaining the cathode of the ion source at a potential(s) other than ground for at least a period of time during ion source operation.

13. The method of claim 12, wherein said maintaining of the cathode at a potential other than ground comprises using (a) a zener diode in electrical communication with the cathode, and/or (b) a thyristor in electrical communication with the cathode, in order to maintain the cathode at a potential other than ground.

14. The method of claim 12, further comprising causing both the power supply and the cathode to be not grounded.

15. A method of making a coated article, the method comprising:
    providing an ion source including an anode, a cathode and a conductive wall(s), the wall(s) at least partially surrounding a deposition chamber, and wherein a power supply is in electrical communication with the anode and/or cathode of the ion source;
    providing a substrate in the deposition chamber; and
    ion beam depositing a layer on the substrate while maintaining the cathode of the ion source at a potential(s) other than ground for at least a period of time while the layer is being deposited on the substrate.

16. The method of claim 15, wherein said maintaining of the cathode at a potential other than ground comprises using (a) a zener diode in electrical communication with the cathode, and/or (b) a thyristor in electrical communication with the cathode, in order to maintain the cathode at a potential other than ground.

17. The method of claim 15, further comprising causing both the power supply and the cathode to be not grounded.

* * * * *